United States Patent [19]

Ierardi et al.

[11] Patent Number: 4,803,424
[45] Date of Patent: Feb. 7, 1989

[54] SHORT-WIRE BED-OF-NAILS TEST FIXTURE

[75] Inventors: Joseph A. Ierardi, North Attleboro; Wayne S. Alden, III, Whitman, both of Mass.

[73] Assignee: Augat Inc., Mansfield, Mass.

[21] Appl. No.: 91,593

[22] Filed: Aug. 31, 1987

[51] Int. Cl.$^4$ .................. G01R 1/04; G01R 1/073
[52] U.S. Cl. .................. 324/158 F; 324/73 PC; 324/158 P
[58] Field of Search .......... 324/73 PC, 158 P, 158 F; 439/66, 65, 219

[56] References Cited

U.S. PATENT DOCUMENTS

| 4,232,928 | 11/1980 | Wickersham | 324/158 P |
| 4,357,062 | 11/1982 | Everett | 324/158 F |
| 4,636,026 | 1/1987 | Cooney et al. | 439/819 |

FOREIGN PATENT DOCUMENTS

| 3441578 | 5/1986 | Fed. Rep. of Germany | 324/158 F |
| 2453417 | 12/1980 | France | 324/158 F |
| 0084568 | 4/1986 | Japan | 324/158 F |
| 8401831 | 5/1984 | PCT Int'l Appl. | 324/158 F |
| 2086670 | 5/1982 | United Kingdom | 324/158 F |
| 2111307 | 6/1983 | United Kingdom | 324/73 PC |
| 2183938 | 6/1987 | United Kingdom | 324/73 PC |

OTHER PUBLICATIONS

"Semiconductor Chip-Sensing Device", by Lipschutz, IBM Tech. Disc. Bull., 6/1966, vol. 9, #1, pp. 100-101, 324-158F.

Primary Examiner—Reinhard J. Eisenzopf
Assistant Examiner—W. Burns
Attorney, Agent, or Firm—Weingarten, Schurgin, Gagnebin & Hayes

[57] ABSTRACT

A test fixture for automatic testing equipment including short wire interface assembly which permits the interface assembly to be hard wired to a test head assembly with relative short interconnect wires. The interface SW assembly includes a base cover plate having a plurality of cavities formed therein, a plurality of individual interface strips having flexible vacuum seals affixed thereto and interface contacts disposed therethrough, and a plurality of floating captive contacts disposed in the base cover plate to provide mechanical and electrical interfacing between the interface contacts and spring-loaded probes electrically connected to the ATE. The individual interface strips are readily positionable adjacent the test head assembly and rotatable to facilitate hard wiring. The hard wired interface strips are suspended in respective cavities of the base cover plate with the flexible vacuum seals in contact with a surface of the base cover plate. Vacuum pressure applied to one surface of the base cover plate effects sealing engagement between the vacuum seals and the base cover plate. Movement of the floating captive contacts is limited, thereby limiting the deflection of the individual interface strips. The flexible vacuum seals are load-insensitive, that is, the deflection of the interface strips causes a limited flexure in the flexible vacuum seals insufficient to disrupt the atmospheric pressure induced sealing contact between the flexible vacuum seals and the base cover plate.

16 Claims, 7 Drawing Sheets

ATE SPRING-LOADED PROBES

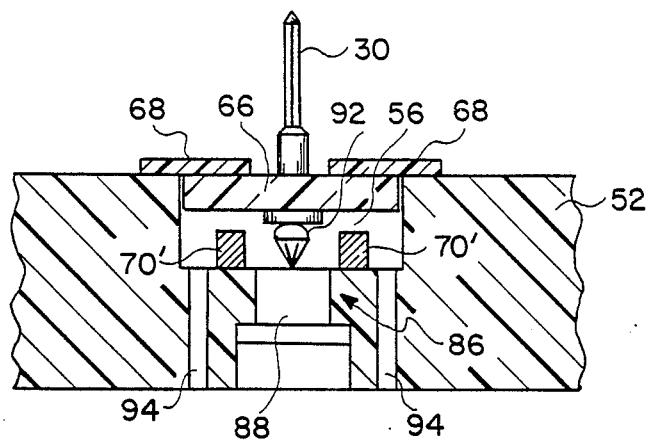
_Fig 6A_
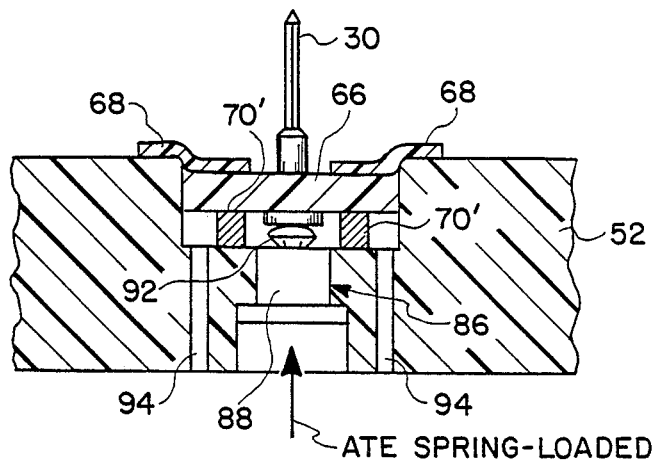
_Fig 6B_

SHORT-WIRE BED-OF-NAILS TEST FIXTURE

FIELD OF THE INVENTION

This invention relates to the field of test fixtures for automatic testing equipment, and more particularly to a bed-of-nails vacuum-operated test fixture wherein short wires are used to electrically hard wire a short wire interface assembly to a test head assembly.

BACKGROUND OF THE INVENTION

Test fixtures are utilized to removably retain an electronic circuit device or unit under test (UUT) in electrical communication with automatic test equipment (ATE). The ATE is operative to ascertain whether the UUT conforms to a predetermined standard of quality as well as functioning to provide a source of vacuum pressure for vacuum-operated test fixtures.

A vacuum-operated test fixture is structurally configured so that one side of the UUT is exposed to a vacuum condition while the other side is exposed to atmospheric pressure, the atmospheric pressure acting against the UUT to removably retain the UUT in physical contact with the test fixture, and consequently in electrical communication with the ATE. A typical prior art bed-of-nails vacuum-operated test fixture used for quality control testing of UUTs is shown in FIGS. 1A and 1B.

The bed-of-nails test fixture 10 of FIG. 1A includes a movable test head assembly 12 adapted to removably retain the electronic circuit device to be tested and an interface assembly 14 adapted to mechanically and electrically interface with the ATE. The UUT 16 is disposed adjacent a support structure 18 of the test head assembly 12, as shown in FIG. 1B. The surface of the UUT 16 facing the support structure 18 includes UUT test points 20.

The support structure 18 has a plurality of contact sockets 22 extending therethrough with the wire-wrap terminal portions thereof projecting from the surface of the support structure 18 distal the UUT 16. The plurality of contact sockets 22 correspond to the UUT test points 20 and contain spring-loaded contacts 24 which electrically engage the UUT test points 20 during vacuum operation of the test head assembly 12, i.e., when atmospheric pressure acts to force the UUT 16 against the support structure 18.

The interface assembly 14 includes a bottom pan 26 having an interface panel 28 affixed thereto. A plurality of interface contacts 30 are disposed to extend through the interface panel 28 such that the head portions thereof lie flush with one surface of the interface panel 28 and the wire-wrap terminal portions thereof project outwardly from the other surface of the interface panel 28. The head portions of the interface contacts 30 electrically interface with spring-loaded probes electrically connected to the ATE.

By moving the test head assembly 12 the bed-of-nails test fixture 10 may be positioned in an "open" or "closed" configuration. Testing of the UUTs 16 is accomplished with the test fixture 10 in the "closed" configuration wherein the test head assembly 12 is disposed within the bottom pan 26 of the interface assembly 14 such that the support structure 18 is parallel and superjacent to the interface panel 28. In the "closed" configuration the wire-wrap terminal portions of the contact sockets 22 and the interface contacts 30 are disposed in parallel proximity.

To complete the electrical test circuit between the test head assembly 12 and the spring-loaded probes electrically connected to the ATE, the wire-wrap terminal portions of the contact sockets 22 are hard wired to the wire-wrap terminal portions of the interface contacts 30 with the bed-of-nails test fixture 10 in the "open" configuration. In the "open" configuration the support structure 18 is disposed to lie in substantially perpendicular to the interface panel 28, as shown in FIG. 1A, such that there is a maximal separation between the wire-wrap terminal portions of the contact sockets 22 and the interface contacts 30.

Hard wiring is effected by wrapping first ends of interconnect wires 32 to the wire-wrap terminal portions of the contact sockets 22 and wrapping the second ends of the interconnect wires 32 to the wire-wrap terminal portions of the interface contacts 30. Hard wiring of the test fixture 10 in the "open" configuration necessitates the use of interconnect wires 32 which are relatively lengthy, having a length in the range of twelve to forty inches, due to the maximal separation between the wire-wrap terminal portions of the contact sockets 22 and the interface contacts 30.

The use of lengthy interconnect wires, however, creates relatively long signal paths between the UUT 16 and the ATE, a condition which is disadvantageous in real time testing of UUTs due to increased response time for the circuit. Additionally, long signal paths are generally high impedance paths which adversely affect the testing of UUTs because of unwanted capacitive, inductive and/or resistive effects.

SUMMARY OF THE INVENTION

The present invention surmounts the inherent disadvantages of the prior art by means of a short wire (SW) interface assembly, which in combination with a test head assembly, forms a short-wire bed-of-nails test fixture which is readily hard wired using relatively short, on the order of four to eight inches, interconnect wires between the SW interface assembly and the test head assembly.

The SW interface assembly includes a base cover plate having a plurality of cavities formed in one surface thereof. The opposite or lower surface of the base cover plate is adapted to interface with the ATE in such manner that the lower surface may be subjected to a vacuum pressure generated by the ATE. A plurality of individual interface strips having flexible vacuum seals affixed thereto are adapted to be suspended in respective cavities so that the outer edges of the flexible vacuum seals contact the one surface of the base cover plate. Each individual interface strip has one or more rows of interface contacts disposed therethrough in such manner that the head portions thereof are disposed flush to the surface of the interface strip facing the bottom wall of the cavities. The wire-wrap terminal portions of the interface contacts project outwardly from the other surface of the interface strip.

The adaptability of each individual interface strip to be positioned adjacent the test head assembly permits the use of short interconnect wires when hard wiring the test head assembly to the interface assembly. The wire-wrap terminal portions of the interface contacts of each individual interface strip are readily positioned adjacent a corresponding set of wire-wrap terminal portions of the contact sockets of the test head assembly, the contact sockets having been prewired with short interconnect wires. To complete the hard wiring each individual interface strip is rotated one hundred and eighty degrees so that the wire-wrap terminal portions of the interface contacts are readily accessible for wire wrapping. After wire wrapping has been completed each individual interface strip is rotated back to its original position for subsequent disposition in the cavities of the base cover plate.

Floating captive contacts are disposed in the holes formed in the base cover plate so that first contact portions thereof are disposed in the cavities and adapted to electrically contact the head portions of corresponding interface contacts and second contact portions thereof are disposed adjacent the lower surface of the base cover plate and adopted to electrically contact spring-loaded probes electrically connected to the ATE. Coaction between the floating captive contacts and the base cover plate limits the translational range of the floating captive contacts to a predetermined distance.

During vacuum operation the high initial loading of the spring-loaded probes of the ATE is transmitted through the floating captive contacts to the head portions of the interface contacts. However, due to the limited translational range of the floating captive contacts, only an attenuated effect of the high initial loading is experienced by the head portions of the interface contacts. The net effect is that the individual interface strips undergo a translation less than the predetermined distance which causes a limited flexure of the flexible vacuum seals.

The flexible vacuum seals are dimensioned to be load-insensitive, that is, when the interface strips are translated, the limited flexure can be sustained in the flexible vacuum seals while the outer edges thereof are maintained in sealing contact with the base cover plate.

BRIEF DESCRIPTION OF THE DRAWINGS

A more complete understanding of the present invention and the attendant advantages and features thereof will be more readily understood by reference to the following detailed description when considered in conjunction with the accompanying drawings wherein:

FIG. 6A is a partial cross-sectional view of an alternative embodiment of a SW interface assembly according to the present invention utilizing a Squirt rivet; and FIG. 6B is a partial cross-sectional view of the SW interface assembly of FIG. 6A in the evacuated test configuration.

DETAILED DESCRIPTION OF THE PREFERRED EMBODIMENTS

Figure 1A:
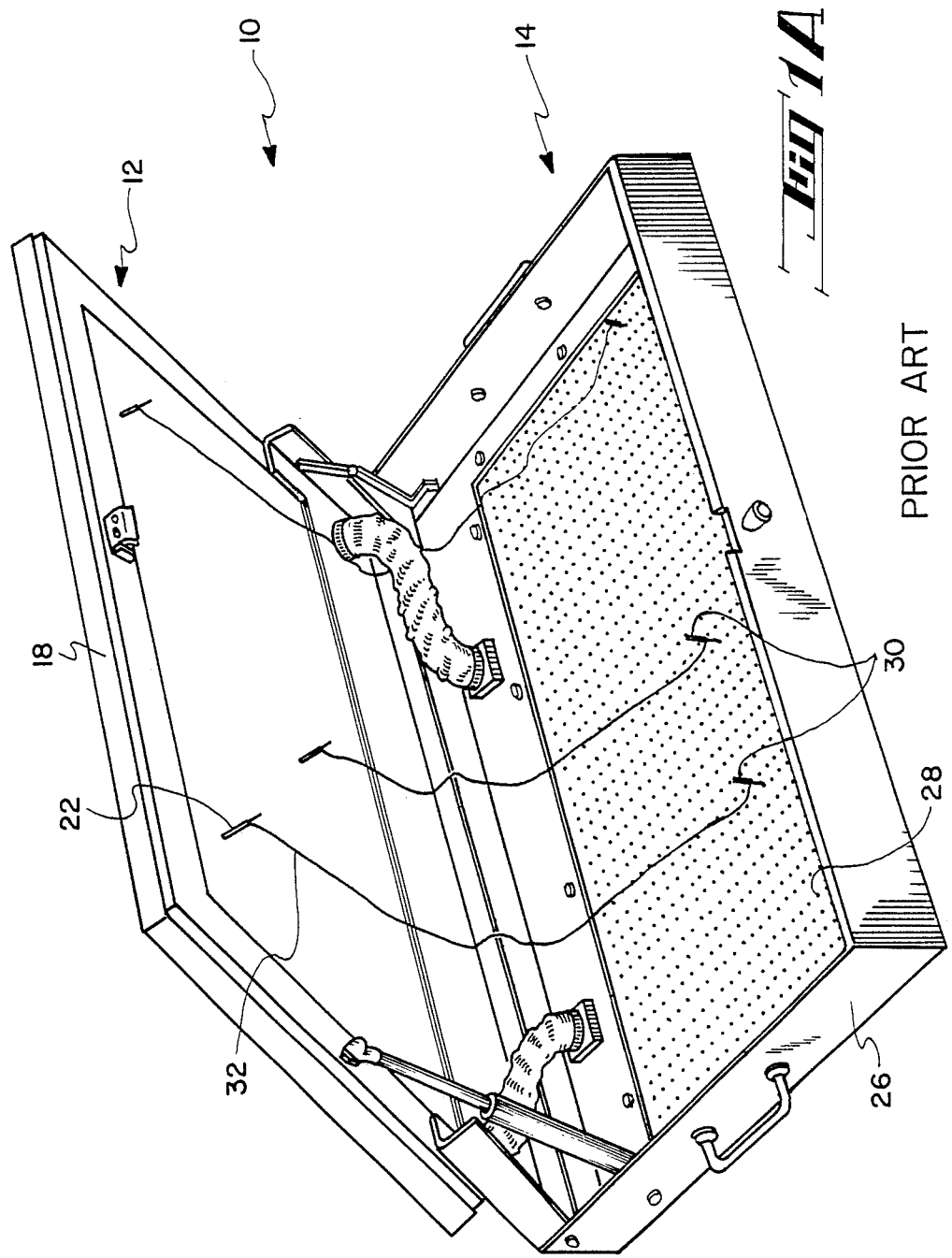
FIG. 1A is a perspective view of a prior art bed-of-nails type test fixture in a partially "open" configuration.
Figure 1B:
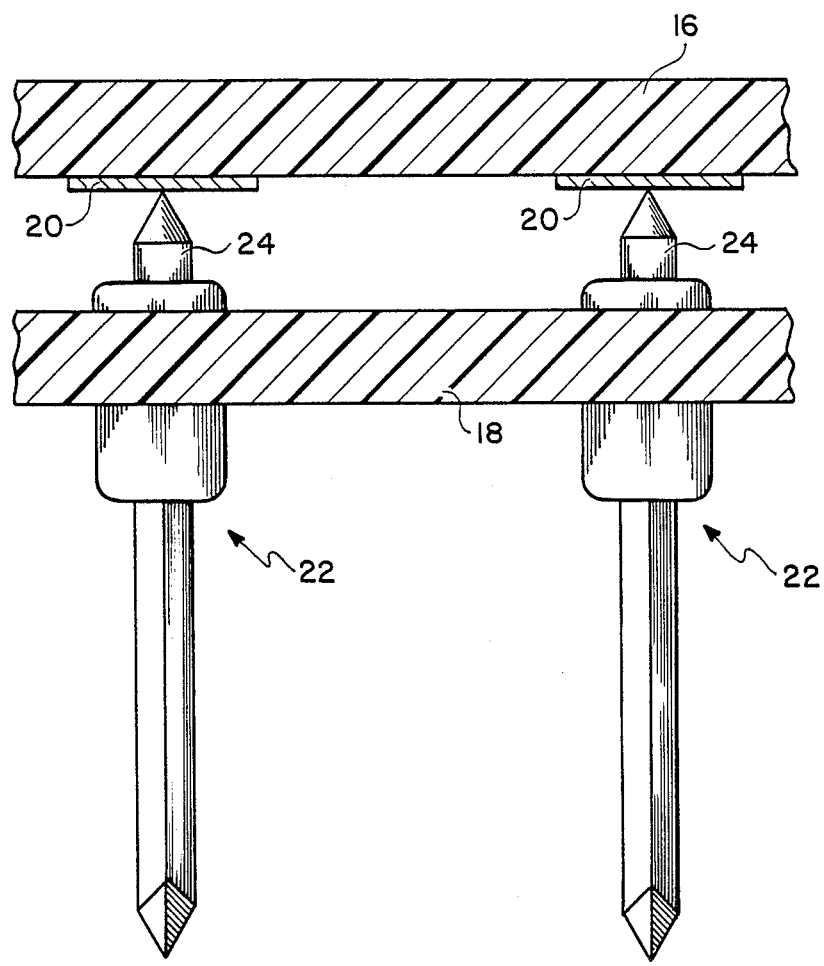
FIG. 1B is a partial cross-sectional view of the test head assembly of the test fixture of FIG. 1A.
Figures 2A, 2B:
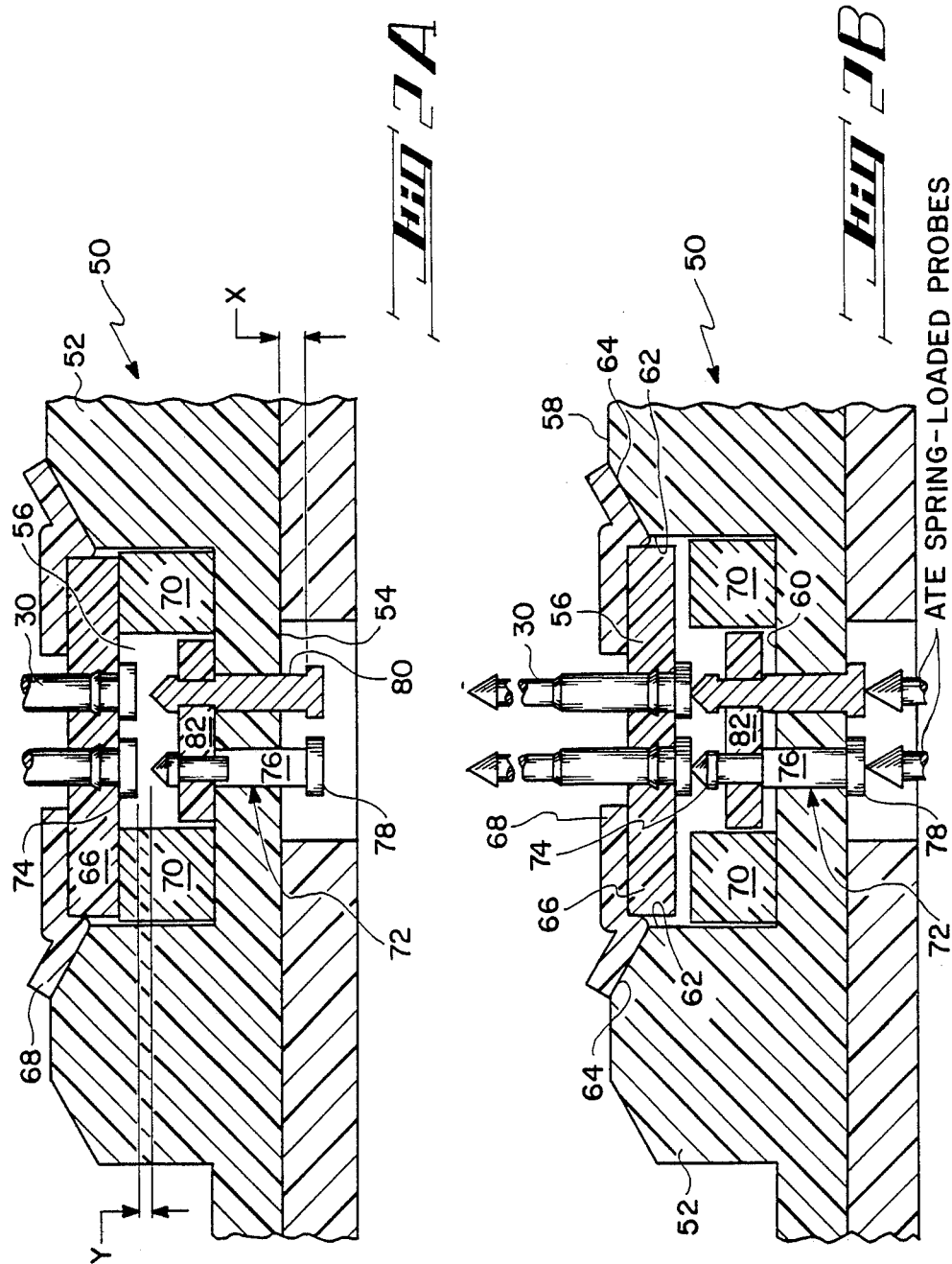
FIG. 2A is a partial cross-sectional view of a short wire interface assembly according to the present invention.
FIG. 2B is a partial cross-sectional view of the SW interface assembly of FIG. 2A in the evacuated test configuration.

Referring now to the drawings wherein like reference numerals designate corresponding or similar elements throughout the several views, there is shown generally in FIGS. 2A and 2B a partial cross-sectional view of a short wire (SW) interface assembly 50 according to the present invention. The SW interface assembly 50, as described in greater detail hereinbelow, functions in combination with the test head assembly 12 described hereinabove to form a short-wire bed-of-nails test fixture 10' for use in combination with ATE to test UUTs.

The SW interface assembly 50 includes a base cover plate 52 formed from a suitable nonconducting material and adapted to interface with the ATE in such a manner that a vacuum pressure can be maintained against a lower surface 54 side thereof. Alternatively, the base cover plate 52 may be affixed to the bottom pan 26 as described hereinabove while still being adapted to interface with the ATE in such a manner that a vacuum pressure can be maintained against the lower surface 54 side thereof. A plurality of cavities 56 are formed in the opposite surface 58 of the base cover plate 52. The cavity 56 embodiment illustrated in FIGS. 2A and 2B has a bottom wall 60, sidewalls 62 extending substantially orthogonally from the bottom wall 60 and tapered walls 64 extending from the sidewalls 62 to the opposite surface 58.

Figure 3B:
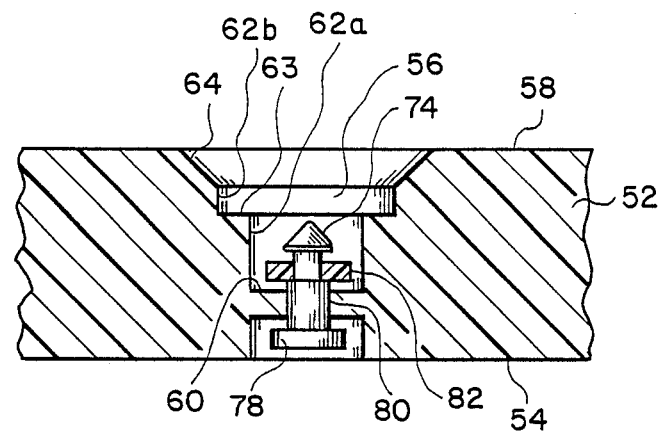
FIG. 3B is a partial cross-sectional view showing a floating captive contact of FIG. 3A mounted in the cavity of the base cover plate.
Figure 3C:
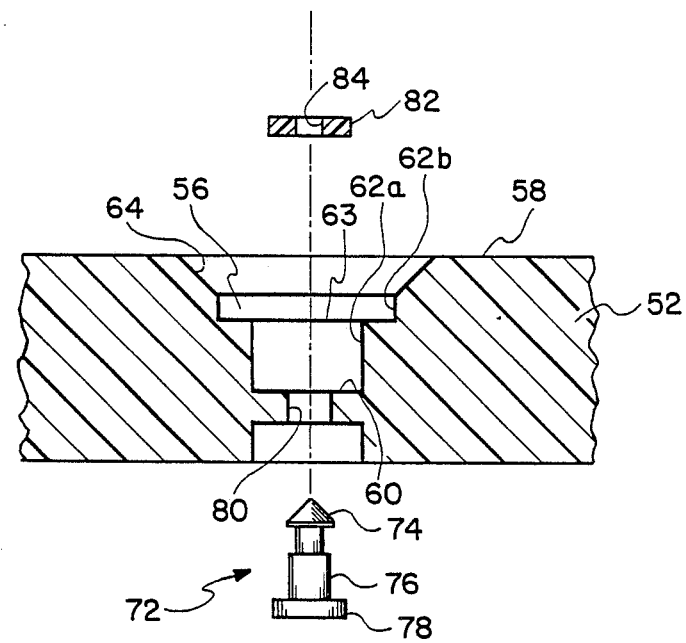
FIG. 3A is a partial cross-sectional view illustrating a method of mounting a floating captive contact in a cavity of the base cover plate.

An alternative embodiment of a cavity 56 is illustrated in FIGS. 3A and 3B. This cavity 56 has a stepped configuration, having first sidewalls 62a extending substantially orthogonally from the bottom wall 60, plateaus 63 extending substantially orthogonally from the first sidewalls 62a and second sidewalls 62b extending substantially orthogonally from the plateaus 63 to the tapered walls 64.

A plurality of individual interface strips 66, the interface strips 66 having flexible vacuum seals 68 securely affixed thereto, are adapted to be suspended in corresponding ones of the plurality of cavities 56, as shown in FIG. 2A. The outer edges of the flexible vacuum seals 68 are adapted to contact the tapered walls 64 of the cavities 56. Prior to the application of vacuum pressure against the lower surface 54 side of the base cover plate 52 each interface strip 66 is supported within its corresponding cavity 56 by means of support blocks 70 shown in FIG. 2A, or the plateaus 63 of the cavity 56 embodiment of FIG. 3A.

The individual interface strips 66 have one or more rows of interface contacts 30 as described hereinabove disposed therethrough. The head portions of the interface contacts 30 lie flush against the surface of the interface strip 66 facing the bottom wall 60 of the cavity 56 and the wire-wrap terminal portions of the interface contacts 30 project outwardly from the other surface of the interface strip 66. The head portions of the interface contacts 30 electrically interface with floating captive contacts 72 as described hereinbelow. The floating captive contacts 72 are adapted to coact with the spring-loaded probes electrically connected to the ATE as described hereinbelow.

The individual interface strips 66 with flexible vacuum seals 68 according to the present invention permit the wire-wrap terminal portions of the interface contacts 30 to be hard wired to the wire-wrap terminal portions of the contact sockets 22 by means of short interconnect wires 32', that is interconnect wires 32' having a length in the range of four to eight inches. Each individual interface strip 66 with interface contacts 30 can readily be positioned adjacent the corresponding contact sockets 22 since the individual interface strips 66 are not secured to the base cover plate 52 by any mechanical or adhesive attachment means. Prior to the vacuum operation of the ATE the individual interface strips 66 are disposed in contact with the base cover plate 52 due to gravitational effects. During the vacuum operation of the ATE the atmospheric pressure acts against the outer edges of the flexible vacuum seals 68 to press same against the tapered walls 64 of the base cover plate 52.

Figure 4B:
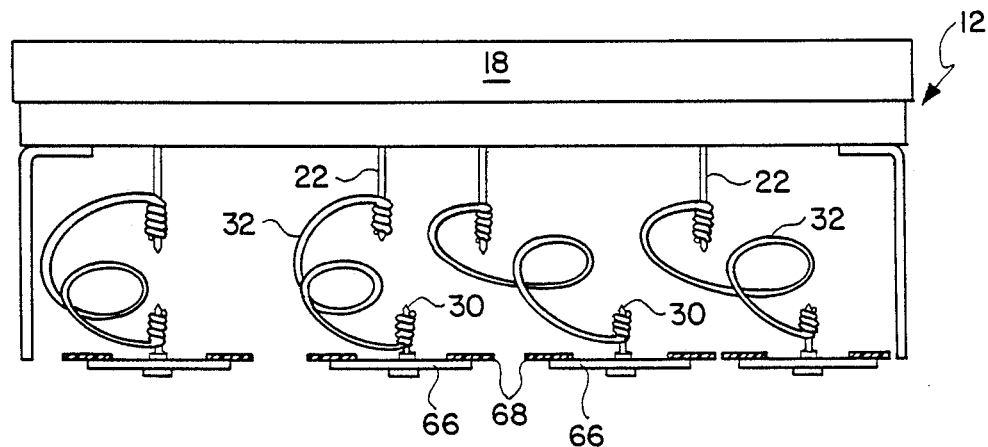
FIG. 4B is a partial cross-sectional view depicting a plurality of hard wired interface strips positioned for suspension with the cavities of the base cover plate.
Figure 4A:
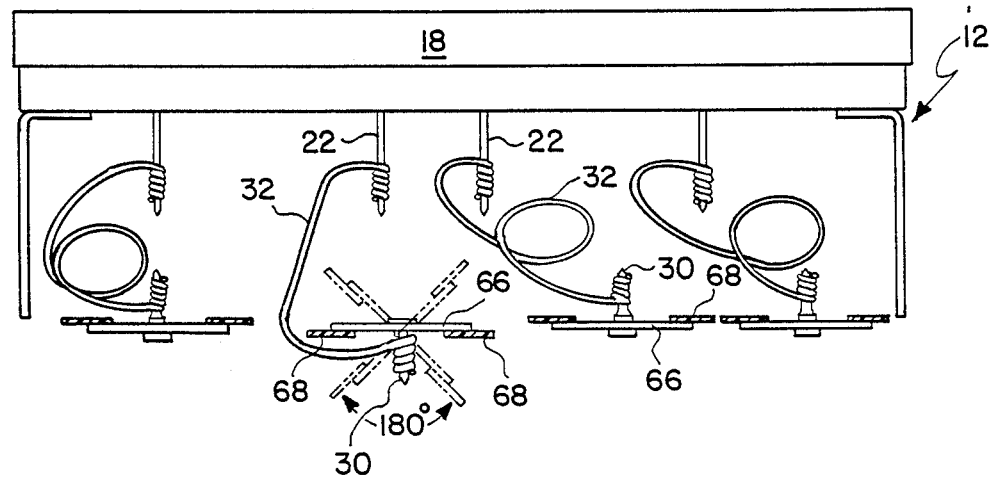
FIG. 4A is a partial cross-sectional view showing an interface strip rotated into a position for an interface contact disposed therethrough to be hard wired by an interconnect wire to a contact socket of the test head assembly.

To hard wire the wire-wrap terminal portions of the interface contacts 30 of the individual interface strips 66, the wire-wrap terminal portions of the interface contacts 30 of each interface strip 66 are positioned adjacent the wire-wrap terminal portions of the contact sockets 22 of the test head assembly 12 which have been prewired with short interconnect wires 32'. The interface strip 66 is rotated one hundred and eighty degrees to the position shown in FIG. 4A where the wire-wrap terminal portions of the interface contacts 30 are readily accessible to be wire wrapped. From this position the second ends of the short interconnect wires 32' are easily wrapped about the wire-wrap terminal portions of the interface contacts 30. The hard wired interface strip 66 is then rotated one hundred and eighty degrees to the position shown in FIG. 4B. After all hard wiring has been completed, with the short-wire bed-of-nails test fixture 10' in the "closed" configuration, the hard wired interface strips 66 are suspended in respective ones of the cavities 56, as shown in FIG. 2A and described hereinabove.

Figure 5A:
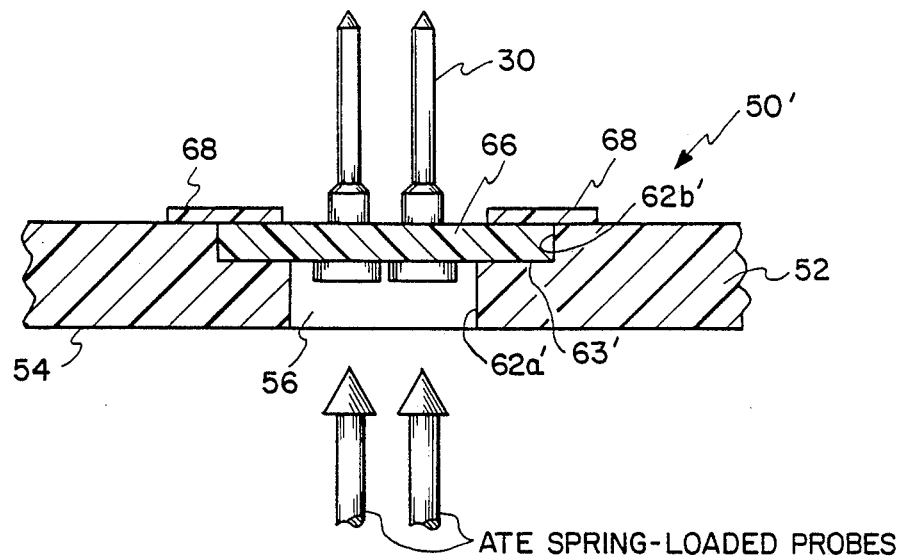
FIG. 5A is a partial cross-sectional view of a prototype interface assembly having individual interface strips.

A short-wire test fixture 10" utilizing the SW interface assembly 50' of FIG. 5A was a prototype embodiment of the present invention as herein disclosed. Hard wired individual interface strips 66 with flexible vacuum seals 68 and interface contacts 30 were suspended in respective cavities 56 having first sidewalls 62a', plateaus 63' and second sidewalls 62b' as shown. In theory, a vacuum pressure applied against the lower surface 54 side of the base cover plate 52 would be communicated to one side of the interface strips 66 so that the atmospheric pressure exerted against the other side of the interface strips 66 maintained the interface strips 66/flexible vacuum seals 68 in sealed engagement with the base cover plate 52, as shown in FIG. 5A.

Figure 5B:
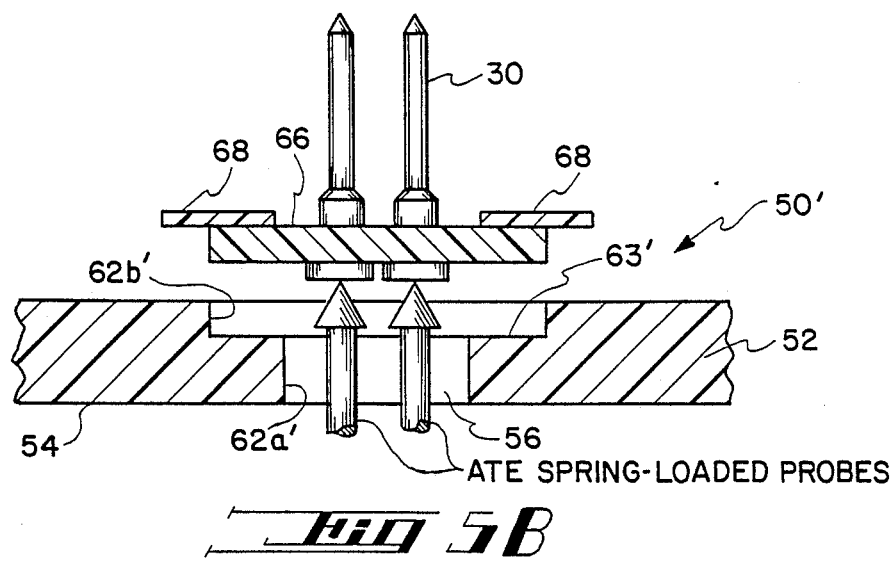
FIG. 5B is a partial cross-sectional view of the prototype interface assembly of FIG. 5A illustrating a seal failure due to high initial loading from a spring-loaded probe of the ATE.

In practice, however, it was discovered that individual interface strips 66/flexible vacuum seals 68 were subjected to high initial loading from the spring-loaded probes of the ATE and that such loading could disengage the interface strips 66/flexible vacuum seals 68 from a sealed condition with respect to the base cover plate 52 if the atmospheric pressure forces were insufficient (due to incomplete evacuation on the lower surface 54 side of the base cover plate 52) to counteract such loading. As shown in FIG. 5B, disengagement of even one interface strip 66/flexible vacuum seal 68 would cause a seal failure, which leads to further attenuation of the atmospheric pressure forces due to pressure equalization on both sides of the interface strip 66/flexible vacuum seal 68.

To prevent the possibility of seal failure due to high initial loading from the spring-loaded probes of the ATE, the present invention utilizes floating captive contacts 72 positioned between the head portions of the interface contacts 30 disposed in the individual interface strips 66 and the spring-loaded probes electrically connected to the ATE. The floating captive contacts 72 are designed to have a limited range of travel, designated by X in FIG. 2A, due to the structural coaction between the lower surface 54 of the base cover plate 52 and the floating captive contacts 72.

Each floating captive contact 72 comprises a first contact portion 74 which is adapted to electrically interface with the head portion of a corresponding interface contact 30, a body portion 76 and a second contact portion 78 which is adapted to coact with the corresponding spring-loaded probe electrically connected to the ATE. In addition, the second contact portion 78 physically abuts the lower surface 54 of the base cover plate 52 under the loading impetus of the corresponding spring-loaded probe, thereby limiting the travel range of the floating captive contacts 72 to a predetermined distance X. As shown in FIG. 3A in one preferred embodiment the first contact portion 74 has an arrow-shaped configuration and the second contact portion has a flat-head configuration.

The floating captive contacts 72 are disposed in FCC holes 80 formed in the base cover plate 52, the FCC holes 80 forming a passageway between the lower surface 54 of the base cover plate 52 and a corresponding cavity 56. The floating captive contacts 72 are inserted into the FCC holes 80 from the lower surface 54 side of the base cover plate 52, as depicted in FIG. 3A.

Each floating captive contact 72 is retained within its respective FCC hole 80 by means of an FCC collar 82. The FCC collar 82 is a strip of nonconducting resilient material such as Teflon having a collar hole 84 formed therethrough, the diameter of the collar hole 84 being slightly smaller than the maximum dimension of the first contact portion 74 of the floating captive contact 72. The first contact portion 74 is force fitted through the collar hole 84 of the FCC collar 82, the collar hole 84 subsequently contracting to its original diameter to engage the body portion 76 of the floating captive contact 72 in such manner that the second contact portion 78 thereof is disposed the distance X below the lower surface 54 of the base cover plate 52 with the FCC collar 82 resting on the bottom wall 60 of the cavity 56.

An alternative embodiment of the SW interface assembly 50 is shown in FIGS. 6A and 6B. Spring-loaded contacts 86, such as the type disclosed in U.S. Pat. No. 4,636,026, issue Jan. 13, 1987, for an "Electrical Test Probe", are disposed in the cavity 56 to interact with the head portions of the interface contacts 30 disposed in the individual interface strips 66. The spring-loaded contacts 86 are loaded in sockets 88 which are fixedly secured in bores 90 formed through the base cover plate 52 as shown in FIG. 6A. Head portions 92 of the spring-loaded contacts 86 are positioned in the cavity 56 directly in line with the head portions of the interface contacts 30. The spring-loaded contacts 86 are adapted for resilient translation within the sockets 88 due to forces exerted on the head portion 92 thereof.

As shown in FIG. 6A, the interface strip 66 is suspended in the cavity 56 in such manner that with the flexible vacuum seal 68 of the interface strip 66 in contact with the opposite surface 58 of the base cover plate 52 the head portion of the interface contact 30 is in close proximity or in light contact with the head portion 92 of the spring-loaded contact 86.

The vacuum pressure applied against the lower surface 54 side of the base cover plate 52 is communicated to the cavities 56 by any of the means known to those skilled in the art. For example, vacuum access ports 94 could be formed in the base cover plate 52 between the lower surface 54 and the cavities 56 as shown in FIGS. 6A and 6B. Alternatively, lengthwise access grooves could be formed in the captive floating contacts 72 for the embodiment of FIGS. 2A and 2B to communicate the vacuum pressure applied against the lower surface 54 to the cavities 56.

With a vacuum pressure applied in the cavities 56, atmospheric pressure forces exerted against the interface strips 66/flexible vacuum seals 68 of the SW interface assembly 50 illustrated in FIG. 2A cause the flexible vacuum seals 68 to be sealingly pressed against the tapered walls 64. The initial high loading of the spring-loaded probes of the ATE is transmitted to the second contact portions 78 of the captive floating contacts 72. Since the structural configuration of the SW interface assembly 50 limits the travel of the second contact portions 78 to the predetermined distance X, the interface strips 66 are pushed through a vertical distance of about X-Y, the distance Y defining an initial distance between the first contact portions 74 and the head portions of the interface contacts 30 when the interface strips 66/flexible vacuum seals 68 are loosely suspended in the cavities 56.

The flexible vacuum seals 68 are dimensioned to be load-insensitive, that is, when the interface strips 66 are forced through the vertical distance X-Y, a flexure 100 can be sustained in the flexible vacuum seals 68 while the outer edges thereof are maintained in sealing contact with the tapered walls 64.

For the alternative embodiment illustrated in FIGS. 6A and 6B, the sockets 88, fixedly secured in the base cover plate 52, are immobile when the high initial load of the spring-loaded probes electrically connected to the ATE is applied against the bottoms thereof, as shown in FIG. 6A, such that the high initial loading exerted by the spring-loaded probes is not transmitted to the individual interface strips 66. Atmospheric pressure acting on the opposite surface 58 and the individual interface strips 66 causes the head portion of the interface contacts 30 to be pressed against the head portion 92 of the spring-loaded contacts 86, thereby causing the spring-loaded contacts 86 to translate within the sockets 88. The increasing resistance of the spring-loaded contacts 86 to resilient translation within the sockets 88 limits the movement of the individual interface strips 66 and the flexure 100 of the flexible vacuum seals 68 as shown in FIG. 6B. Support blocks 70' may be disposed in the cavities 56 to limit the movement of the interface strips 66.

A variety of modifications and variations of the present invention are possible in light of the above teachings. It is therefore to be understood that within the scope of the appended claims, the present invention may be practiced otherwise than as specifically described hereinabove.

What is claimed as new and desired to be secured by Letters Patent of the United States is:

1. A short wire bed-of-nails vacuum-operated test fixture for use in combination with automatic testing equipment to test an electronic circuit device having a plurality of test points disposed in a predetermined configuration on one major surface thereof, vacuum pressure applied to said short wire bed-of-nails vacuum-operated test fixture acting on the one major surface of the electronic circuit device to removably retain the electronic circuit device in contact with said short wire bed-of-nails vacuum operated test fixture by means of atmospheric pressure acting on the other major surface of the electronic circuit device, the automatic testing equipment including spring-loaded probe means for mechanically and electrically engaging said short wire bed-of-nails vacuum-operated test fixture, said short wire bed-of-nails vacuum-operated test fixture comprising:

test head assembly means for removably retaining the electronic circuit device to be tested, said test head assembly means including
      electrical contact means for wire wrapping disposed in a predetermined configuration corresponding to the predetermined configuration of test points on the one major surface of the electronic circuit device to be tested, and
      means for resiliently contacting the predetermined configuration of test points of the electronic circuit device with vacuum pressure applied to said short wire bed-of-nails vacuum-operated test fixture;
   short wire interface assembly means for interfacing with the automatic testing equipment and said electrical contact means of said test head assembly means to apply electrical test signals from the automatic testing equipment to the electronic circuit device to be tested said short wire interface assembly means including
      cover plate means for interfacing with the automatic testing equipment, said cover plate means having a plurality of cavities formed therein,
      interface contact means for wire wrapping with said electrical contact means of said test head assembly means to provide electrical continuity between said test head assembly means and said short wire interface assembly means,
      rotatable interface strip means suspended in said plurality of cavities for captively retaining said interface contact means, said rotatable interface strip means sealingly engaging said cover plate means with vacuum pressure applied to said short wire bed-of-nails vacuum-operated test fixture, and
      means disposed in said cover plate means and extending into said plurality of cavities for providing mechanical and electrical interfacing between said interface contact means and the spring-loaded probe means and for limiting initial loading effects exerted by the spring-loaded probe means with vacuum pressure applied to said short wire bed-of-nails vacuum-operated test fixture to maintain said rotatable interface strip means in sealing engagement with said cover plate means; and short interconnect wire means for wire wrapping between said electrical contact means of said short wire interface assembly means and said interface contact means of said test head assembly means to provide electrical continuity between said test head assembly means and said short wire interface assembly means; wherein said rotatable interface strip means is rotated approximately one hundred and eighty degrees to effect wire wrapping between said electrical contact means and said interface contact means and is reversely rotated approximately one hundred and eighty degrees for suspension in said plurality of cavities and sealing engagement with said cover plate means.

2. The test fixture of claim 1 wherein said rotatable interface strip means further comprises flexible sealing means for providing the sealing engagement between said rotatable interface strip means and said cover plate means with vacuum pressure applied to said short wire bed-of-nails vacuum-operated test fixture, said flexible sealing means flexing in response to the initial loading effects exerted by the spring-loaded probe means to maintain said rotatable interface strip means in sealing engagement with said cover plate means.

3. A short wire bed-of-nails vacuum-operated test fixture for use in combination with automatic testing equipment to test an electronic circuit device having a plurality of test points disposed in a predetermined configuration on one major surface thereof, vacuum pressure applied to said short wire bed-of-nails vacuum-operated test fixture acting on the one major surface of the electronic circuit device to removably retain the electronic circuit device in contact with said short wire bed-of-nails vacuum-operated test fixture by means of atmospheric pressure acting on the other major surface of the electronic circuit device, the automatic testing equipment including spring-loaded probe means for mechanically and electrically engaging said short wire bed-of-nails vacuum-operated test fixture, said short wire bed-of-nails vacuum-operated test fixture comprising:

test head assembly means for removably retaining the electronic circuit device to be tested, said test head assembly means including electrical contact means for wire wrapping disposed in a predetermined configuration corresponding to the predetermined configuration of test points on the one major surface of the electronic circuit devices to be tested, and means for resiliently contacting the predetermined configuration of test points of the electronic circuit device with vacuum pressure applied to said short wire bed-of-nails vacuum-operated test fixture;

a short wire interface assembly for electrically interconnecting the electronic circuit device removably retained on said test head assembly means to the automatic testing equipment to apply electrical test signals to the electronic circuit device, said short wire interface assembly including a base cover plate having a lower surface and an opposite surface, said lower surface interfacing with the automatic testing equipment, and wherein said base cover plate has a plurality of cavities formed in said opposite surface thereof and a plurality of contact bores extending from said lower surface of said base cover plate to corresponding ones of said plurality of cavities, a plurality of rotatable interface strips suspended in said plurality of cavities and having interface contacts disposed therethrough and wherein each of said plurality of rotatable interface strips has a flexible vacuum seal affixed thereto, said flexible vacuum seal sealingly engaging said base cover plate with vacuum pressure applied to said lower surface thereof due to atmospheric pressure exerted on upper surfaces of said plurality of rotatable interface strips, a plurality of floating captive contacts disposed in respective ones of said plurality of contact bores and extending into said corresponding cavity, said plurality of floating captive contacts providing mechanical and electrical interfacing between said interface contacts disposed through said plurality of rotatable interface strips and the spring-loaded probe means of the automatic testing equipment and limiting initial loading effects exerted on said plurality of rotatable interface strips to maintain said plurality of rotatable interface strip means in sealing engagement with said base cover plate, and means in combination with said plurality of floating captive contacts for retaining said plurality of floating captive contacts disposed in said bores prior to exertion of the initial loading effects on said plurality of floating captive contacts by the spring-loaded probe means, wherein translational movement of said plurality of captive floating contacts is limited by said plurality of floating captive contacts mechanically engaging said base cover plate to thereby limit the initial loading effects exerted by the spring-loaded probe means and to maintain said plurality of rotatable interface strips in sealing engagement with said base cover plate; and short interconnect wire means for hard wiring said interface contacts disposed through said plurality of rotatable interface strips to said electrical contact means of said test head assembly means to provide electrical continuity between said test head assembly means and said short wire interface assembly; wherein each of said plurality of rotatable interface strips is individually rotated approximately one hundred and eighty degrees to effect wire wrapping between said interface contacts thereof and said electrical contact means and is individually reversely rotated approximately one hundred and eighty degrees for suspension in said plurality of cavities and sealing engagement with said base cover plate.

4. The test fixture of claim 1 wherein said mechanical and electrical interface providing means comprises floating captive contact means disposed in said cover plate means and extending into said plurality of cavities for mechanically and electrically engaging said interface contact means by translational movement of said floating captive contact means in response to the initial loading effects exerted by the spring-loaded probe means; and means in combination with said floating captive contact means for retaining said floating captive contact means disposed in said cover plate means prior to exertion of the initial loading effects on said floating captive contact means by the spring-loaded probe means;
wherein translational movement of said rotatable interface strip means is limited by said floating captive contact means mechanically engaging said cover plate means to thereby limit the initial loading effects exerted by the spring-loaded probe means and to maintain said rotatable interface strip means in sealing engagement with said cover plate means.

5. The test fixture of claim 4 wherein said retaining means is a collar force fitted in combination with said floating captive contact means.

6. The test fixture of claim 1 wherein said mechanical and electrical interface providing means comprises
socket means fixedly disposed in said cover plate means for limiting the initial loading effects exerted by the spring-loaded probe means by remaining immobile during mechanical and electrical engagement with the spring-loaded probe means; and
spring-loaded contact means disposed in said socket means for mechanically and electrically engaging said interface contact means with vacuum pressure applied to said short wire bed-of-nails vacuum-operated test fixture, mechanical engagement between said spring-loaded contact means and said interface contact means causing translational movement of said spring-loaded contact means within said socket means;
wherein translational movement of said rotatable interface strip means is limited by the translational movement of said spring-loaded contact means within said socket means to maintain said rotatable interface strip means in sealing engagement with said cover plate means.

7. A short wire bed-of-nails vacuum-operated test fixture for use in combination with automatic testing equipment to test an electronic circuit device having a plurality of test points disposed in a predetermined configuration on one major surface thereof, vacuum pressure applied to said short wire bed-of-nails vacuum-operated test fixture acting on the one major surface of the electronic circuit device to removably retain the electronic circuit device in contact with said short wire bed-of-nails vacuum-operated test fixture by means of atmospheric pressure acting on the other major surface of the electronic circuit device, the automatic testing equipment including spring-loaded probe means for mechanically and electrically engaging said short wire bed-of-nails vacuum-operated test fixture, said short wire bed-of-nails vacuum-operated test fixture comprising:
test head assembly means for removably retaining the electronic circuit device to be tested, said test head assembly means including
electrical contact means for wire wrapping disposed in a predetermined configuration corresponding to the predetermined configuration of test points on the one major surface of the electronic circuit device to be tested, and
means for resiliently contacting the predetermined configuration of test points of the electronic circuit device with vacuum pressure applied to said short wire bed-of-nails vacuum-operated test fixture;
a short wire interface assembly for electrically interconnecting the electronic circuit device removably retained on said test head assembly means to the automatic testing equipment to apply electrical test signals to the electronic circuit device, said short wire interface assembly including
a base cover plate having a lower surface and an opposite surface, said lower surface interfacing with the automatic testing equipment, and wherein said base cover plate has a plurality of cavities formed in said opposite surface thereof and a plurality of socket bores extending from said lower surface of said base cover plate to corresponding ones of said plurality of cavities,
a plurality of rotatable interface strips suspended in said plurality of cavities and having interface contacts disposed therethrough, and wherein each of said plurality of rotatable interface strips has a flexible vacuum seal affixed thereto, said flexible vacuum seal sealingly engaging said base cover plate with vacuum pressure applied to said lower surface thereof due to atmospheric pressure exerted on upper surfaces of said plurality of rotatable interface strips,
a plurality of sockets securedly disposed in respective ones of said plurality of socket bores for limiting the initial loading effects exerted by the spring-loaded probe means by remaining immobile during mechanical and electrical engagement with the spring-loaded probe means, and
spring-loaded contact means disposed in each of said plurality of sockets for mechanically and electrically engaging said corresponding interface contact with vacuum pressure applied to said short wire bed-of-nails vacuum-operated test fixture, mechanical engagement between said spring-loaded contact means and said corresponding interface contact causing translational movement of said spring-loaded contact means within said socket,
wherein translational movement of said plurality of rotatable interface strips is limited by the translational movement of said spring-loaded contact means within said socket to maintain said plurality of rotatable interface strips in sealing engagement with said base cover plate; and
short interconnect wire means for hard wiring said interface contacts disposed through said plurality of rotatable interface strips to said electrical contact means of said test head assembly means to provide electrical continuity between said test head assembly means and said short wire interface assembly; wherein
each of said plurality of rotatable interface strips is individually rotated approximately one hundred and eighty degrees to effect wire wrapping between said interface contacts thereof and said electrical contact means and is individually reversely rotated approximately one hundred and eighty degrees for suspension in said plurality of cavities and sealing engagement with said base cover plate.

8. The test fixture of claim 3 wherein each of said plurality of cavities includes a bottom wall, sidewalls extending from said bottom wall and tapered walls extending from said corresponding sidewalls to said opposite surface of said base cover plate.

9. The test fixture of claim 3 wherein each of said plurality of cavities includes a bottom wall, first sidewalls extending from said bottom wall, plateaus extending from said corresponding first sidewalls, second sidewalls extending from said corresponding plateaus, and tapered walls extending from said corresponding second sidewalls to said opposite surface of said base cover plate.

10. The test fixture of claim 7 wherein each of said plurality of cavities includes a bottom wall, sidewalls extending from said bottom wall and tapered walls extending from said corresponding sidewalls to said opposite surface of said base cover plate.

11. The test fixture of claim 7 wherein each of said plurality of cavities includes a bottom wall, first sidewalls extending from said bottom wall, plateaus extending from said corresponding first sidewalls, second sidewalls extending from said corresponding plateaus, and tapered walls extending from said corresponding second sidewalls to said opposite surface of said base cover plate.

12. The test fixture of claim 1 wherein said short wire interface assembly means further includes means disposed in said plurality of cavities for supporting said rotatable interface strip means suspended therein prior to applying vacuum pressure to said short wire bed-of-nails vacuum-operated test fixture.

13. The test fixture of claim 3 wherein said short wire interface assembly further includes means disposed in said plurality of cavities for supporting said plurality of rotatable interface strips suspended therein prior to applying vacuum pressure to said short wire bed-of-nails vacuum-operated test fixture.

14. The test fixture of claim 7 wherein said short wire interface assembly means further includes means disposed in said plurality of cavities for acting in combination with said spring-loaded contact means to limit the translational movement of said plurality of rotatable interface strips.

15. The test fixture of claim 9 wherein said plateaus are means disposed in said plurality of cavities for supporting said plurality of rotatable interface strips suspended therein prior to applying vacuum pressure to said short wire bed-of-nails vacuum-operated test fixture.

16. The test fixture of claim 11 wherein said plateaus are means disposed in said plurality of cavities for acting in combination with said spring-loaded contact means to limit the translational movement of said plurality of rotatable interface strips.

* * * * *